Feb. 12, 1963 R. E. VOSTEEN 3,077,566

TRANSISTOR OPERATIONAL AMPLIFIER

Filed June 1, 1961

INVENTOR

Robert E. Vosteen

BY Irons, Birch, Swindler & McKie

ATTORNEYS

United States Patent Office 3,077,566

Patented Feb. 12, 1963

3,077,566

TRANSISTOR OPERATIONAL AMPLIFIER

Robert E. Vosteen, Middleport, N.Y., assignor to Monroe Electronics, Inc., Middleport, N.Y., a corporation of New York Filed June 1, 1961, Ser. No. 114,113
12 Claims. (Cl. 330—14)

This application relates to transistor amplifiers and, more particularly, to D.-C. operational transistor amplifiers having certain particularly desirable characteristics.

Operational amplifiers are now used for a great number of purposes both in and out of the computing field. Such amplifiers may cover a whole gamut of uses from ones in which high voltage amplification is required (e.g. a transducer amplifier) to ones in which unity gain is necessary (e.g. an inverting amplifier). Because of the frequency characteristics of D.-C. coupled amplifiers, it is difficult to arrive at a design which will exhibit extremely high open-loop gain, yet which will have a broad bandwidth of useful response down to unity gain. The amplifier of this invention is designed to furnish such characteristics, having an open-loop voltage gain of at least 10,000 a short circuit current gain of at least 100,000, full output to at least 10 kc.s. and unity gain bandwidth to at least 500 kc.s. at reduced amplitude.

It is of course well-known that high voltage amplification can be obtained in transistor amplifiers by use of very high collector impedances. One previous suggestion for obtaining such high impedances without necessitating the use of high voltage bias sources involves the use of opposite polarity, or complementary, type transistors connected collector-to-collector, with the input connected either to the base of one transistor or, in parallel, to the bases of both transistors (Shockley Patent No. 2,666,818). This type of circuit, however, is inherently unstable because, with the resultant extremely high dynamic impedances, any small change in operating currents can cause a shift in operating point over the entire range from one saturation condition to the other, thus making the amplifier quite useless. However, if negative feedback is employed with such an amplifier, stability can be achieved, and, particularly if a stage of gain precedes the collector-to-collector circuit, the effect of instability of that circuit can be diminished.

Since operational amplifiers are customarily employed with negative feedback, the collector-to-collector circuit is particularly useful therein. However, the use only of a single stage of gain even with the high gain obtainable from the collector-to-collector configuration, is frequently insufficient for operational amplifiers design. As indicated above, it is desirable to precede the collector-to-collector circuit with a stage of gain, to reduce the effect of its instability. Further, it is essential to follow that circuit with an extremely high impedance in order that the gain of which it is capable may not be dissipated. Since operational amplifiers are frequently operated into low impedance loads, a third amplifier stage, which may be merely an impedance matching device, is desirable.

When a plurality of amplifier stages are cascaded together and used with negative feedback, as in an operational amplifier, the additive effects of their phase lags will interfere with their use down to low gain level, unless special provision is made to widely separate their "turnover frequencies" (the frequency at which the gain vs. frequency characteristic of each stage changes from an essentially flat curve to a 6 *db* per octave decreasing slope). The amplifier of the present invention is especially designed for wide separation of turnover frequencies, so that it may be operated down to unity gain without oscillation or objectionable transient response, but yet with wide bandwidth.

An essential characteristic of the present invention is the drive of both the collector-to-collector transistors with signal current, but not in parallel from the signal source, as in the Shockley patent, supra, but rather from the respective collectors of a pair of transistors arranged in differential amplifier configuration. With this arrangement complete symmetry of operation is obtained, particularly for saturating input currents.

The above and other features of the invention will now be more fully described in connection with preferred embodiments thereof shown in the accompanying drawing.

Figure 1:
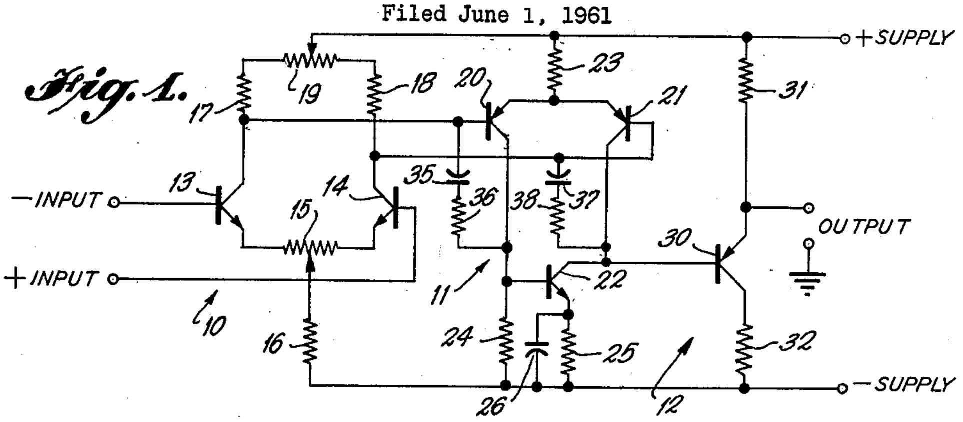
FIG. 1 is a schematic diagram of a preferred embodiment of the invention.

Referring first to FIG. 1, the amplifier of the invention includes three stages identified respectively by the numerals 10–12. The first stage 10 includes a pair of NPN transistors 13 and 14 arranged in differential amplifier configuration with the negative and positive input terminals respectively connected to the bases of the two transistors. The emitters of the transistors are connected to outside terminals of a potentiometer 15 having its movable contact connected through a resistor 16 to the negative supply terminal. The collectors of transistors 13 and 14 are respectively connected through resistors 17 and 18 to the outside terminals of a potentiometer 19 whose movable contact is connected to the positive supply terminal.

The second stage of the amplifier includes a pair of PNP transistors 20 and 21 and NPN transistor 22. Transistors 20 and 21 are connected in differential amplifier fashion with their bases respectively connected directly to the collectors of transistors 13 and 14. The emitters of transistors 20 and 21 are connected through resistor 23 to the positive supply terminal. The collector of transistor 21 is connected directly to the collector of transistor 22, while the base of the latter transistor is connected directly to the collector of transistor 20. The junction between the collector of transistor 20 and the base of transistor 22 is connected to the negative supply terminal through a resistor 24, but the collector of transistor 21 is connected to the negative supply terminal through the transistor 22. The emitter of transistor 22 is connected to the negative supply terminal through the shunt combination of a resistor 25 and a capacitor 26.

The third stage 12 of the amplifier is connected as an emitter follower, using a PNP transistor 30. The base of the transistor is connected directly to the junction between the collectors of transistors 21 and 22, while the emitter is connected through resistor 31 to the positive supply terminal and the collector is connected through resistor 32 to the negative supply terminal. Of course an NPN transistor could be used at 30 if the collector were connected to the positive supply terminal and the emitter to the negative terminal. The output of the amplifier is available between the emitter of transistor 30 and ground.

The second stage 11 of the amplifier of FIG. 1 operates to obtain an extremely high voltage gain, of the order of 1,000 in a typical circuit. This gain is achieved by reason of the collector-to-collector connection of complementary transistors 21 and 22, together with the symmetrical drive of transistor 22 obtained from both transistor 20 and 21 of the differential amplifier connection. With resistors 24 and 25 of equal value, transistor 22 functions as a unity current gain stage as to signals derived from the collector of transistor 20. The common collectors of transistors 21 and 22 are thereby fed by a push-pull signal, thereby in effect doubling the gain over that which would be obtained if transistor 22 had its base statically biased, rather than fed from the collector of transistor 20. Moreover, and more importantly, the symmetrical drive for the output emitter follower produces symmetrical high frequency output performance which may be appreciated by considering the action of the second stage in response to a saturating input signal.

An additional advantage of this configuration including the drive of transistor 22 in its base circuit from the collector of transistor 20 and in its collector circuit from the collector of transistor 21, is the realization of automatic balance between the quiescent collector currents of transistors 20 and 21.

If transistor 22 were merely replaced by a resistor, the gain that would be achieved by the use of the differential amplifier configuration of transistors 20 and 21 would be of the order of $1/10$ that which can be obtained from the collector-to-collector arrangement. However, this inherent gain would not be useful if the output circuit included a relatively low resistance. In order to provide the necessary high resistance for the output of the second stage of gain, the emitter follower 30, which has a very high base input resistance, is employed. Resistor 32 in that circuit is merely for protection purposes to prevent damage to the transistor 30 in the event of short circuiting of the output terminals.

The amplification stage 10 including differentially connected transistors 13 and 14 provides several very useful characteristics. In the first place, it provides a gain, which in an illustrative circuit is of the order of 10, thus diminishing the effect of the instability of the collector-to-collector configuration by reason of preceding that instability with a relatively high gain. In the second place, it provides for an input circuit which is based upon ground, like the output circuit, an essential characteristic of operational amplifiers.

The potentiometers 15 and 19 in the first stage 10 are provided for balancing purposes in order that the collector voltages in the input stage may be of the same value. In some cases only one of the potentiometers is necessary. With potentiometer 19 only, less noise is generated and higher voltage gain realized while, with potentiometer 15 only, the best balancing action is obtained. In a commercial embodiment only the emitter portentiometer 15 was employed. The resistor 16 must be of much higher resistance than the potentiometer for satisfactory gain to be obtained.

As is obvious from the above description, the amplifier circuit of FIG. 1 must be supplied with suitable D.-C. voltages to provide the bias levels for the transistors. A suitable source might include a set of batteries with center tap grounded and with positive and negative terminals available for connection between the positive and negative supply terminals of the circuit.

It was indicated in the introductory portion of this specification that cascading together different stages of amplification makes it necessary to make some provision for prevention of undesirable frequency characteristics, particularly at low gain. For instance, if three identical stages are direct-coupled, their turnover frequencies will be identical and, when they are used with negative feedback, the additive phase lags provided by each stage will result in oscillation of the amplifier circuit. The three amplifier stages of FIG. 1 are particularly designed so that their turnover frequencies are quite different and widely separated, with the result that the total phase change not only does not result in oscillation but also does not cause intolerable transient response down to unity gain, as might be obtained if a total phase lag of over 140° were obtained.

The turnover frequency is, of course, that frequency at which the magnitude of the equivalent source resistance equals the magnitude of the impedance of the distributed capacitance (or in the case of the addition of a physical capacitance, the impedance of the effective combination of the physical and distributed capacitance). The equivalent source resistance of the emitter follower stage 12 is determined by the emitter load which may be of the order of 1,000 ohms. The equivalent load impedance of stage 10 is determined by the resistances 17 and 18 in parallel with the input impedances of transistors 20 and 21 and may typically be of the order of 5,000 ohms. The turnover frequency of stage 12 is therefore typically of the order of five times the turnover frequency of stage 10, a desirable separation achieved by reason of the types of stages chosen. In an illustrative case, the respective turnover frequencies of stages 10 and 12 might be, typically, 2 mc.s. and 10 mc.s.

By reason of the collector-to-collector configuration of stage 11, its equivalent source resistance is much higher than that of either of the other stages and may typically be of the order of 50,000 ohms. If the total equivalent capacitance driven by that source resistance is equal to the equivalent capacitance of each of the other stages, the turnover frequency of stage 11 would be about one-tenth of the turnover frequency of stage 10. In the typical case, the turnover frequency would be 200 kc.s. It will be seen that, even without any physical capacitance in any of the stages, the turnover frequencies thereof are widely separated. However, in the typical case, the gain of stage 10 might be about 10, that of stage 11 about 1,000 and that of stage 12 about 1, giving a total voltage gain of about 10,000 open loop. If the amplifier is to be operated down to unity gain, the amplifier will become unstable at high frequencies, because the turnover frequencies of stages 10 and 11 are still too close together. For this reason, capacitive networks are provided to reduce the turnover frequency of stage 11 to a very much lower value, which may typically be of the order of 100 cycles. These capacitive networks include capacitor 35, which is connected in series with resistor 36 between the base and collector of transistor 20 and capacitor 37 which is connected in series with resistor 38 between the base and collector of transistor 21. The addition of these physical capacitors in effect substantially increase the shunt capacities of the second stage, thereby materially reducing the turnover frequency of that stage. Certain characteristics of this particular circuit arrangement will be more fully disclosed hereinafter, but the circuit arrangement of FIG. 2 will first be detailed.

Figure 2:
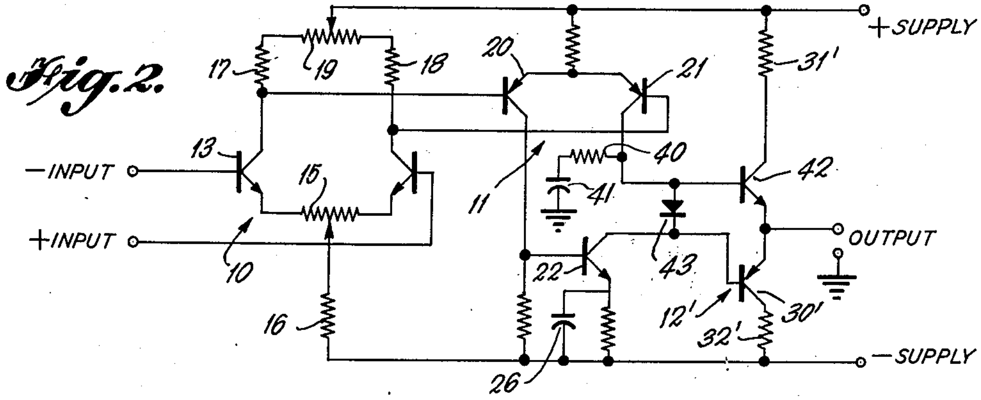
FIG. 2 is a schematic diagram of a modified embodiment employing a different output circuit and a different frequency response circuit than the apparatus of FIG. 1.

The circuit of FIG. 2 includes a first amplifier stage 10 which is identical with the corresponding stage of FIG. 1, and a stage 11 which is identical with the corresponding stage of FIG. 1 except for the capacitive networks. In FIG. 2 the two networks of FIG. 1 are replaced by a single series combination of resistor 40 and capacitor 41 connected between the collector of transistor 21 and ground. This capacitive network performs the same function as the two networks of FIG. 1, but, by reason of the multiplication effect obtained in the circuits of FIG. 1, capacitors 35 and 37 may be much smaller in magnitude in that circuit than is capacitor 41 in FIG. 2. The apparent value of the shunt capacitance afforded by the two physical capacitors 35 and 37 in FIG. 1 is multiplied by the current gain of the transistors. Therefore, capacitors 35 and 37 may typically be of the order of ¼0 of the size of capacitor 41 in FIG. 2, yet the same reduction in turnover frequency may be achieved.

A further desirable attribute of the capacitive network configuration of FIG. 1 resides in the high frequency response which may be obtained with this network arrangement. This may be appreciated by realizing that the slope of the output wave form is determined by the reciprocal of the capacitance. Therefore, with the much smaller capacitances that are possible with the arrangement of FIG. 1, a much higher slope and therefore a much faster response to high frequencies, may be obtained.

The collector to ground arrangement of the capacitive network shown in FIG. 2 may be utilized when broad band frequency response is not necessary. For instance, in one application of the operational amplifier of this invention, no frequency over 200 cycles per second had to be amplified. The circuit therefore could employ the single R-C network 40, 41 of FIG. 2.

Capacitor 26 of both FIGS. 1 and 2 further improves the high frequency characteristics of the amplifier.

The output stage 12 of FIG. 1 includes only a single emitter follower transistor. If a high efficiency output circuit whose quiescent current at no load is very low as compared to its full load capability, is desired, the output stage 12' of FIG. 2 may be employed. That stage includes a PNP transistor 30' and an NPN transistor 42 having their emitters directly connected together and to the ungrounded output terminal. The bases of the two transistors may be similarly connected together and to the common collectors of stage 11. However, in order to improve linearity, the junction between the collector of transistor 21 and the base of transistor 42 is preferably connected to the junction between the collector of transistor 22 and the base of transistor 30' through a forward-biased junction diode 43. Resistors 32' and 31' are provided to prevent damage to the two transistors in the event of short circuiting of the amplifier output.

Figure 3:
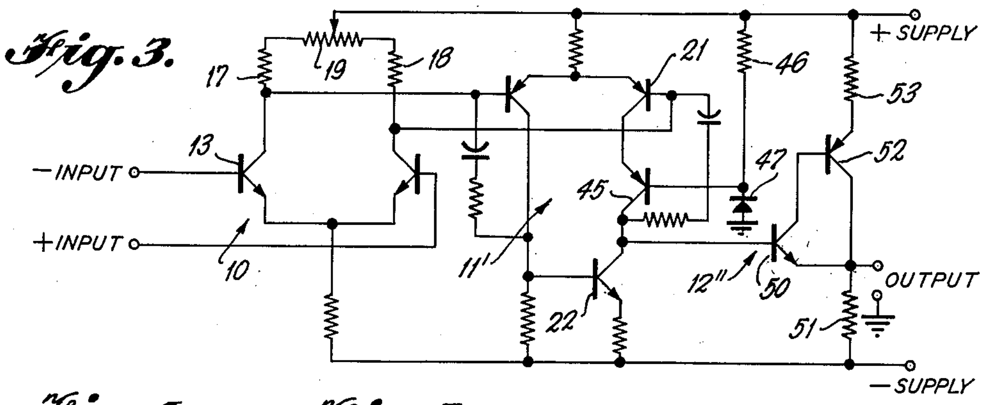
FIG. 3 is a schematic diagram of a further modified embodiment of the invention having certain desirable characteristics by reason of its peculiar output circuit and its use of an additional transistor in the second stage of the amplifier.

In the event that a higher loop gain is desired than is provided by either of the circuits of FIG. 1 and FIG. 2, the circuit of FIG. 3 may be employed. In that circuit, stage 10 is identical with the same stage in FIGS. 1 and 2, but stage 11 includes an additional PNP transistor 45 whose emitter is connected to the collector of transistor 21 and whose collector is connected to the collector of transistor 22. The base of transistor 45 is connected to the positive supply terminal through a resistor 46 and to ground through a Zener diode 47. This arrangement, due to the very low dynamic base impedance of transistor 45, has a source impedance of the order of several megohms, rather than the typical 50,000 ohms which would be obtained with the circuits of FIGS. 1 and 2. In order that the resultant increase in available gain may be utilized, stage 11' must then be connected into a further stage having an impedance of the same order of magnitude. The stages 12 and 12' of FIGS. 1 and 2 are replaced in FIG. 3 by a stage 12'' employing a quasi-complementary amplifier. That amplifier consists of NPN transistor 50 having its base connected to the junction between the collectors of transistors 22 and 45, its emitter connected through resistor 51 to the negative supply terminal and its collector connected to the base of a PNP transistor 52. The collector of transistor 52 is connected directly to the emitter of transistor 50 and the common connection is connected to the ungrounded output terminal. The emitter of transistor 52 is connected to the positive supply lead through resistor 53.

Amplifier stage 12'' is a unity voltage gain stage which has a current gain equal to the product of the current gains of transistors 50 and 52. The input impedance of this stage is therefore basically the output impedance multiplied by the current gain. If, then, the output impedance across the output terminals is at least 1,000 ohms it is readily possible to obtain an input impedance to stage 12'' of at least 1 megohm. With this arrangement, then, the output impedance of stage 11' is satisfactorily matched and the extreme gain available from that stage may be satisfactorily utilized.

Figure 4:
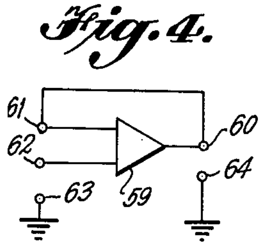
FIG. 4 is a diagrammatic showing of the use of the operational amplifier of the invention in a unity gain, non-inverting configuration.

As is well known, operational amplifiers are capable of a large range of varied uses. In FIG. 4 is shown such an amplifier 59 used to isolate a signal circuit from a load and in which unity gain, without phase inversion, is achieved by the direct connection of the output terminal 60 back to the input terminal 61. The other input terminal 62 and the ground terminal 63 may be connected across the source, which, in a typical case, has a resistance which varies between 1 and 100 ohms. The output impedance across terminals 60 and 64 may be 0.1 ohm and remain constant despite variation in source impedance.

Figure 5:
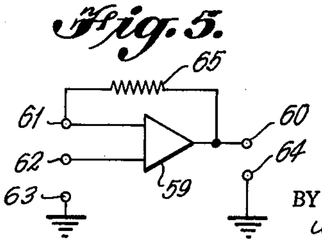
FIG. 5 is a diagrammatic showing of an operational amplifier used for high gain purposes.

In FIG. 5 the operational amplifier 59 is shown in a more typical configuration to achieve a voltage gain determined by the ratio of its feedback and source resistances. In a typical use, the source resistance may be 30 ohms and the feedback resistance 65 may be 12,000 ohms, thereby achieving a voltage gain of 400. The grounded connection of the positive input of the amplifier of course provides for stabilization in operation.

As was indicated above, FIGS. 1–3 of this application merely represent preferred embodiments of the invention. It will be appreciated that many minor modifications or additions to circuits shown in these figures could readily be made without departure from the scope of the invention. For instance, it will be appreciated that polarities of the various transistors could be changed with corresponding changes in other circuits and polarities of like voltages. Many other minor modifications could also be made. The invention therefore is to be measured by the scope of the appended claims rather than limited to the preferred embodiments described herein.

I claim:

1. A direct current differential amplifier arranged for negative feedback between output and input comprising a first and second transistor each of one polarity, a third transistor of opposite polarity, input terminals for supplying differential inputs to the bases of said first and second transistors, positive and negative supply terminals for connection to a suitable source of D.-C. voltage, means connecting the emitters of each of said first and second transistors to one of said supply terminals, direct connections between the collector of said first transistor and the base of said third transistor and between the collectors of said second and third transistors, and means connecting the collector of said first transistor and the emitter of said third transistor to the other supply terminal, the output of the amplifier being available between the collectors of said second and third transistors and a point of common potential.

2. A direct current amplifier arranged for negative feedback between output and input comprising a first and second stage each comprising a pair of transistors arranged in differential amplifier connection with the collectors of the transistors of the first stage directly connected respectively to the bases of the transistors of the second stage, a fifth transistor of opposite polarity to the transistors of the second stage having its collector directly connected to the collector of one of the transistors of said second stage and its base directly connected to the collector of the other transistor thereof, positive and negative supply terminals for connection to a suitable source of D.-C. voltage, and means connecting the electrodes of said transistors to appropriate ones of said terminals to bias the emitters thereof forwardly and the collectors thereof reversely with respect to the bases, the connection of the collector of said one transistor to the supply terminal being through said fifth transistor.

3. An operational amplifier designed for feedback connection between its output and its input and comprising three transistor amplifier stages, the first stage including a pair of transistors with provision for opposite polarity inputs to the respective bases, the second stage including third, fourth and fifth transistors, the third stage including a sixth transistor, the fifth transistor being of opposite polarity to the third and fourth transistors, the bases of the third and fourth transistors being respectively directly connected to the collectors of the transistors of said first stage, the collector of said third transistor being directly connected to the base of said fifth transistor and the collectors of said fourth and fifth transistors being directly connected together and to the base of said sixth transistor, positive and negative supply terminals for connection to a suitable source of D.-C. voltage, means connecting the electrodes of said transistors to appropriate ones of said supply terminals to bias the emitters thereof forwardly and the collectors reversely with respect to the bases, the connection of the collector of said fourth transistor to the supply terminal being through said fifth transistor.

4. An operational amplifier designed for high open-loop gain but for feedback connection between its output and its input and for wide bandwidth down to unity gain comprising three transistor amplifier stages, the first stage comprising a first and second transistor of the same polarity with provision for connection of opposite polarity inputs to their respective bases, the second stage comprising third and fourth transistors of the opposite polarity and a fifth transistor of said same polarity, means directly connecting the bases of said third and fourth transistors respectively to the collectors of said first and second transistors, means directly connecting the collector of said third transistor to the base of said fifth transistor, the third stage comprising a sixth transistor, means directly connecting the collectors of said fourth and fifth transistors together and to the base of said sixth transistor, positive and negative supply terminals for connection to a suitable source of D.-C. voltage, means connecting the electrodes of said transistors to said supply terminals to bias the emitters thereof forwardly and the collectors reversely with respect to the bases, the connection of the collector of said fourth transistor to the supply terminal being through said fifth transistor, and means including a shunt capacitor for reducing the turnover frequency of said second stage to separate the turnover frequencies of the three stages and thereby reduce the possibilities of oscillation with feedback at low gain.

5. The apparatus of claim 4 in which said last-named means includes a second capacitor and a pair of resistors, the series combination of said first-mentioned capacitor and one of said resistors and the series combination of said second capacitor and the other resistor being respectively connected between base and collector of said third and fourth transistors.

6. The apparatus of claim 5 including a potentiometer having its outer terminals connected respectively to the emitters of said first and second transistors and its movable contact connected to the appropriate one of said supply terminals to provide for zero adjustment of the collector currents of said first and second transistors.

7. The apparatus of claim 5 including a potentiometer having its remote terminals respectively connected to the collectors of said first and second transistors and its movable contact connected to the appropriate one of said supply terminals to provide for zero adjustment of the collector currents of said first and second transistors.

8. An operational amplifier designed for feedback connection between its output and its input comprising three transistor amplifier stages, the first stage comprising first and second transistors of the same polarity connected for differential inputs to the bases thereof, the second stage comprising third and fourth transistors of opposite polartiy and a fifth transistor of said same polarity, the bases of said third and fourth transistors being respectively connected directly to the collectors of said first and second transistors, the collector of said third transistor being directly connected to the base of said fifth transistor, said third stage comprising a sixth transistor, the collectors of said fourth and fifth transistors being directly connected together and to the base of said sixth transistor, positive and negative supply terminals for connection to a suitable source of D.-C. voltage, and means connecting the electrodes of said transistors to said supply terminals to bias the emitters thereof forwardly and the collectors reversely with respect to the bases, the connection of the collector of said fourth transistor to the supply terminal being through said fifth transistor.

9. The apparatus of claim 8 further including capacitive means connected to said second stage to reduce the turnover frequency thereof so that the turnover frequencies of said three stages may be widely separated to permit operation with feedback down to low gain.

10. The apparatus of claim 9 in which said capacitive means includes the series combination of a resistor and a capacitor connected between the collectors of said forth and fifth transistors and a common potential point.

11. The apparatus of claim 8 in which said sixth transistor is connected as an emitter follower with output available between its emitter and a common potential point.

12. The apparatus of claim 8 including a seventh transistor of the same polarity as said fourth transistor having its emitter directly connected to the collector of the fourth transistor and its collector directly connected to the collector of said fifth transistor and the base of said sixth transistor, whereby the direct connection of the collector of said fourth transistor to the collector of the fifth transistor and the base of the sixth transistor is through said seventh transistor, said connecting means including the series combination of a resistor and a Zener diode connected between one of the positive and negative terminals and a point of common potential, the base of said seventh transistor being directly connected to the junction between the said resistor and diode.

No references cited.